United States Patent [19]

Dravida

[11] Patent Number: 5,282,214
[45] Date of Patent: Jan. 25, 1994

[54] APPARATUS AND METHOD FOR PARALLEL GENERATION OF CYCLIC REDUNDANCY CHECK (CRC) CODES

[75] Inventor: Subrahmanyam Dravida, Toms River, N.J.

[73] Assignee: AT&T Bell Laboratories, Murray Hill, N.J.

[21] Appl. No.: 26,236

[22] Filed: Mar. 1, 1993

Related U.S. Application Data

[63] Continuation of Ser. No. 595,899, Oct. 11, 1990, abandoned.

[51] Int. Cl.⁵ .................... G06F 11/10; H03M 13/00
[52] U.S. Cl. ................... 371/37.6; 371/37.1; 371/37.7
[58] Field of Search ............... 371/37.1, 37.4, 37.6, 371/37.7; 364/741

[56] References Cited

U.S. PATENT DOCUMENTS

| | | | |
|---|---|---|---|
| 3,805,232 | 4/1974 | Allen | 340/146.1 AL |
| 4,312,068 | 1/1982 | Goss et al. | 371/37 |
| 4,454,600 | 6/1984 | LeGresley | 371/25 |
| 4,498,174 | 2/1985 | LeGresley | 371/37 |
| 4,498,178 | 2/1985 | Ohhashi | 371/37.7 |
| 4,593,393 | 6/1986 | Mead et al. | 371/37 |
| 4,677,623 | 6/1987 | Iwasaki et al. | 371/39.1 |
| 4,809,273 | 2/1989 | Jackowski et al. | 371/3 |
| 4,890,286 | 12/1989 | Hirose | 371/37.1 |
| 5,103,451 | 4/1992 | Fossey | 371/37.6 |
| 5,111,463 | 6/1992 | Zook | 371/39.1 |
| 5,121,396 | 6/1992 | Irvin et al. | 371/53 |

Primary Examiner—Robert W. Beausoliel, Jr.
Assistant Examiner—Trinh Tu
Attorney, Agent, or Firm—Robert P. Marley

[57] ABSTRACT

A method and apparatus are disclosed for the efficient generation of cyclic redundancy check (CRC) codes employing CRC generator polynomials of the form $(1+x) \cdot f(x)$. The efficiency is achieved by independently and concurrently generating in parallel a preliminary CRC code word corresponding to $f(x)$ and a term corresponding to $(1+x)$ over a message $M(x)$. The term corresponding to $(1+x)$ is generated in a manner to have either a zero (0) state or a one (1) state. Then, the term corresponding to $(1+x)$ is used to modify the preliminary CRC code word to obtain an overall CRC code word being generated over message $M(x)$. If the term corresponding to $(1+x)$ is a 0 state, then the overall CRC code word is obtained by shifting the bits of the preliminary CRC code word once to the left. If the term corresponding to $(1+x)$ is a 1 state, then the overall CRC code word is obtained by shifting the bits of the preliminary CRC code word once to the left and adding $f(x)$ to the shifted preliminary CRC code word.

14 Claims, 4 Drawing Sheets

APPARATUS AND METHOD FOR PARALLEL GENERATION OF CYCLIC REDUNDANCY CHECK (CRC) CODES

This application is a continuation of application Ser. No. 07/595,899, filed on Oct. 11, 1990, now abandoned.

TECHNICAL FIELD

This invention relates to the generation of code words and, more particularly, to the generation of cyclic redundancy check (CRC) code words.

BACKGROUND OF THE INVENTION

Cyclic redundancy check (CRC) code words have been generated in both bit serial fashion and bit parallel fashion. In "high" bit rate communications networks it is desirable to generate the CRC code words in parallel fashion. Prior known arrangements for generating the CRC code words in parallel required the use of complex circuit arrangements which were difficult, if at all possible, to realize in usable fashion. This difficulty in implementation arises due to the form of the CRC generator polynomials that are typically employed to generate the CRC code words. In general, the CRC generator polynomials are of the form $(1+x) \cdot f(x)$. The $(1+x)$ factor introduces prohibitive complexity for the prior parallel CRC code word generator arrangements. This is because in the prior arrangements CRC code words were generated by performing division by the entire CRC generator polynomial in one step. Such a division is extremely difficult to realize in a hardware design.

SUMMARY OF THE INVENTION

The problems with prior parallel CRC code word generator arrangements are overcome, in accordance with the invention, by generating an overall CRC code word in a two step process employing a CRC generator polynomial of the form $(1+x) \cdot f(x)$. One step comprises generating a preliminary CRC code word corresponding to f(x). The second step comprises generating a term corresponding to $(1+x)$. These two steps are carried out independently and concurrently in parallel. Upon completion of these two steps, the preliminary CRC code word and the term corresponding to $(1+x)$ are combined in a prescribed manner to generate the overall CRC code word.

More specifically, the overall CRC code word is obtained by advantageously utilizing the term corresponding to $(1+x)$ to modify the preliminary CRC code word corresponding to f(x) in a prescribed manner. The term corresponding to $(1+x)$ is either a zero (0) state or a one (1) state. If this term is a 0 state, then the overall CRC code word is obtained by modifying the preliminary CRC code word in a first prescribed manner, i.e., by shifting the bits of the preliminary CRC code word corresponding to f(x) once to the left. If this term is a 1 state, then the overall CRC code word is obtained by modifying the preliminary CRC code word in a second prescribed manner, i.e., by shifting the bits of the preliminary CRC code word corresponding to f(x) once to the left and adding f(x) to the shifted preliminary CRC code word.

DETAILED DESCRIPTION

Prior to describing the details of one implementation of the invention it is felt that a theoretical discussion of the principles underlying the invention would be helpful.

Theoretical Discussion

In the following, we briefly review properties of Cyclic Redundancy Check (CRC) codes. A CRC code is a polynomial code in the sense that bit strings are treated as representations of polynomials with coefficients of 0 and 1 only. An n-bit message is regarded as the coefficient list for a polynomial with (n) terms, ranging from $x^{n-1}$ to $x^0$. Polynomial arithmetic is done modulo 2, according to the rules of algebraic field theory. Hence, both addition and subtraction are identical to an EXCLUSIVE OR function.

In the following, we fix the length of messages including the CRC field to be (n) and denote the generator polynomial by G(x). Assume that the degree of G(x) is (r).

It is known that, if $(x+1)$ divides the generator polynomial G(x) and G(x) does not divide (x) and $(x^k+1)$ for any (k) up to (n), then the Hamming weights of nonzero legal polynomials are at least four (4). This provides a method for finding the generator polynomial of a CRC code which can provide a Hamming distance of four (4).

The following polynomials have become international standards:

$$G(x)=(1+x+x^4+x^5+x^9+x^{10})=(1+x)(1+x^4+x^9); \quad (1)$$

$$G(x)=(1+x+x^2+x^3+x^{11}+x^{12})=(1+x)(1+x^2+x^{11}); \text{ and} \quad (2)$$

$$G(x)=(1+x^2+x^{15}+x^{16})=(1+x)(1+x+x^{15}) \quad (3)$$

for CRC-10, CRC-12 and CRC-16, respectively. All three of the polynomials are of the form $(1+x) \cdot f(x)$, where f(x) is a primitive polynomial. The function $(1+x)$ is a factor in the generator polynomial which provides a Hamming distance of four (4). It will be apparent that other polynomials may be equally employed in practicing the invention.

A CRC code word generation procedure and apparatus are described that are especially suited to such polynomials and enables very simple parallel implementation in accordance with the invention. The notation, $$\left\lfloor \frac{g(x)}{h(x)} \right\rfloor$$

is used to represent the remainder obtained upon dividing a polynomial g(x) by a polynomial h(x).

Let G(x), the CRC generator polynomial be such that, $$G(x) = (1+x)f(x). \tag{4}$$

Let M(x) be the message polynomial whose CRC code is desired and let (r) be the number of check bits (i.e. degree of G(x)). Now f(x) has degree (r−1).

It is then desired to compute the remainder R(x) given by, $$R(x) = \left\lfloor \frac{x^r M(x)}{G(x)} \right\rfloor. \tag{5}$$

Remainder R'(x) is defined as, $$R'(x) = \left\lfloor \frac{x^{r-1} M(x)}{f(x)} \right\rfloor. \tag{6}$$

In other words R'(x) is the CRC code for M(x), when f(x) is the generator polynomial, i.e., R'(x) is a preliminary CRC code word corresponding to f(x).

Equation (6) can be rewritten as, $$x^{r-1} M(x) = Q'(x) \cdot f(x) + R'(x), \tag{7}$$

where Q'(x) is the quotient polynomial. Next, a term corresponding to (1+x) is defined as, $$R''(x) = \left\lfloor \frac{Q'(x)}{(1+x)} \right\rfloor. \tag{8}$$

That is, R''(x) is the remainder obtained upon dividing Q'(x) by (1+x).

Equation (8) can be rewritten as, $$Q'(x) = Q''(x) \cdot (1+x) + R''(x), \tag{9}$$

where Q''(x) is the appropriate quotient polynomial.

Putting equation (9) into equation (7) and multiplying throughout by (x) results in, $$x^r M(x) = x \cdot Q''(x) \cdot (1+x) \cdot f(x) + x \cdot R''(x) \cdot f(x) + x \cdot R'(x). \tag{10}$$

Since the remainder operator is linear, dividing equation (10) throughout by (1+x)·f(x) yields, $$\left\lfloor \frac{x^r \cdot M(x)}{G(x)} \right\rfloor = \left\lfloor \frac{x \cdot R''(x) \cdot f(x)}{(1+x) \cdot f(x)} \right\rfloor + \left\lfloor \frac{x \cdot R'(x)}{(1+x) \cdot f(x)} \right\rfloor. \tag{11}$$

This is because the first term on the right side of equation (10) yields a remainder of zero (0). Now, R''(x) is of degree zero (0) and, therefore, x·R''(x)·f(x) is of degree (r). The degree of (1+x)·f(x) is (r). Therefore, exactly one division is needed to generate the remainder $$\left\lfloor \frac{x \cdot R''(x) \cdot f(x)}{(1+x) \cdot f(x)} \right\rfloor.$$

Since R''(x) is of degree zero (0), it can take one of two values, i.e., 0 or 1. If term R''(x) is 0, then the remainder is zero (0). If term R''(x) is 1, then it is only necessary to generate $$\left\lfloor \frac{x f(x)}{(1+x) \cdot f(x)} \right\rfloor$$

and the result is f(x).

Referring to the second term on the right side of equation (11). R'(x) is of degree (r−2) and x·R'(x) is of degree (r−1). The denominator is of degree (r). Therefore, the result is x·R'(x). This merely involves a shift to the left of the bits of R'(x).

The desired end result R(x) is, $$R(x) = \begin{cases} f(x) + R'(x) \cdot x & \text{if } R''(x) = 1 \\ x \cdot R'(x) & \text{if } R''(x) = 0 \end{cases}. \tag{12}$$

Generation of the overall CRC code involves two steps: the generation of R'(x) which is a preliminary CRC code of M(x) with f(x) as the generator polynomial and the generation of R''(x) which is a term corresponding to (1+x). Once these two steps are completed the desired overall CRC code, i.e., remainder R(x), is very simply obtained by using equation (12), in accordance with the invention.

The following describes the parallel generation of R'(x) and R''(x).

By way of an example, a 16-bit implementation is employed, however, it will be apparent that the results are generalized to any other implementation, whether it is byte based or 32 bit based.

Let M(x) have the polynomial representation, $$M(x) = \sum_{i=0}^{k-1} a_i x^i, \tag{13}$$

where (k) is the message length. Equation (13) can be rewritten as, $$M(x) = \sum_{i=0}^{k-1} A_i x^{16i}, \tag{14}$$

where, $$A_i = \sum_{j=i-16}^{i-1} a_j \cdot x^{j-i+16}. \tag{15}$$

Multiplying equation (14) by $x^{r-1}$ results in, $$x^{r-1} \cdot M(x) = \sum_{i=0}^{k-1} (A_i x^{r-1}) x^{16i}. \tag{16}$$

The following recursion is defined as, $$B_i = x^{16}[A_{k-1-i} x^{r-1} + B_{i-1}] \tag{17}$$

with the boundary condition, $B_{-1}=0$.

From the definition of equation (17), $$B_0 = x^{16} \cdot A_{k-1} \cdot x^{r-1};$$

$$B_1 = x^{16} \cdot A_{k-2} \cdot x^{r-1} + x^{32} \cdot A_{k-1} \cdot x^{r-1};$$

$$B_i = x^{16} \cdot A_{k-1-i} \cdot x^{r-1} + x^{32} A_{k-i} \cdot x^{r-1}; \text{ and}$$

$$B_{k-2} = x^{16} A_1 x^{r-1} + \ldots + x^{16(k-1)} A_{k-1} x^{r-1}. \quad (18)$$

Therefore, equation (16) can be rewritten as, $$x^{r-1} \cdot M(x) = A_0 \cdot x^{r-1} + B_{k-2}. \quad (19)$$

Then, by definition, $$r_i(x) = \left\lfloor \frac{A_{k-1-i} \cdot x^{r-1} + x^{16} \cdot r_{i-1}(x)}{f(x)} \right\rfloor, \quad (20)$$

with the boundary condition $r_{-1}(x)=0$. An alternative representation of equation (20) is, $$A_{k-1-i} \cdot x^{r-1} + x^{16} \cdot r_{i-1}(x) = f(x) \cdot C_i(x) + r_i(x), \quad (21)$$

where, $C_i(x)$ is the appropriate quotient polynomial.

Putting equation (21) into equation (17) results in, $$B_0 = x^{16} \cdot r_0(x) + x^{16} \cdot f(x) \cdot C_0(x). \quad (22)$$

Substituting equation (22) and equation (21) into equation (17) results in, $$B_1 = x^{16} \cdot r_1(x) + x^{16} \cdot f(x)[C_1(x) + x^{16} \cdot C_0(x)]. \quad (23)$$

Carrying out the recursion in equation (17) results in, $$B_{k-2} = x^{16} \cdot r_{k-2}(x) + f(x) \left[ \sum_{i=1}^{k-1} x^{16i} \cdot C_{k-1-i}(x) \right]. \quad (24)$$

Putting equation (24) into equation (19) results in, $$x^{r-1} \cdot M(x) = r_{k-1}(x) + f(x) \left[ \sum_{i=1}^{k-1} x^{16i} \cdot C_{k-1-i}(x) \right]. \quad (25)$$

The remainder operator is linear.

Dividing equation (25) by f(x) results in, $$R'(x) = \left\lfloor \frac{x^{r-1} M(x)}{f(x)} \right\rfloor = r_{k-1}(x), \quad (26)$$

since the second term on the right side of equation (25) produces a zero (0) remainder. Also, $$Q'(x) = \sum_{i=0}^{k-1} C_i(x) x^{16(k-1-i)}, \quad (27)$$

where Q' as defined earlier is the quotient produced by the division in equation (26). By definition the following recursion is obtained, $$D_i(x) = x^{16}[C_i(x) + D_{i-1}(x)], \quad (28)$$

with boundary condition, $D_{-1}=0$.

Carrying out the recursion in equation (28) results in, $$Q'(x) = C_{k-1}(x) + D_{k-2}(x). \quad (29)$$

By definition, $$t_i(x) = \left\lfloor \frac{C_i(x) + x^{16} \cdot t_{i-1}(x)}{1+x} \right\rfloor \quad (30)$$

with the boundary condition, $t_{-1}=0$.

Alternatively, equation (30) can be written as, $$C_i(x) + x^{16} \cdot t_{i-1}(x) = (1+x)E_i(x) + t_i(x), \quad (31)$$

where $E_i(x)$ is a quotient polynomial. Substituting equation (31) into equation (28), carrying out the recursion and combining with equation (29), results in, $$Q'(x) = t_{k-1}(x) + (1+x) \left[ \sum_{i=0}^{k-1} x^{16i} \cdot E_{k-1-i}(x) \right]. \quad (32)$$

Dividing throughout equation (32) by (1+x) and using the fact that the remainder is a linear operator, results in, $$R''(x) = \left\lfloor \frac{Q'(x)}{(1+x)} \right\rfloor = t_{k-1}(x). \quad (33)$$

In order to arrive at the overall implementation, R'(x) is obtained recursively in equation (28) and R''(x) is obtained recursively in equation (33).

The key step involved in generating R'(x) is the recursion specified in equation (20). Since f(x) is of degree (r−1), $r_{i-1}(x)$ is of degree (r−2). Therefore, $x^{16} \cdot r_{i-1}$ is of degree (14+r). Since $A_{k-1-i}$ is of degree 15, $A_{k-1-i}(x^{r-1})$ is also of degree (14+r). If a block divider circuit is employed to carry out division by f(x), then the remainder is fed back and added to the incoming 16 bits.

The key step for generating R''(x) is given in equation (30). Here, $t_{i-1}$ is of degree 0, and $x^{16}t_{i-1}$ is of degree 16. $C_i(x)$ is of degree 15. First $C_i(x)$ for a generic polynomial is generated and division by (1+x) can be performed by a block divider circuit.

A technical advantage of this implementation and the invention is that the preliminary CRC code corresponding to f(x) and the term corresponding to (1+x) are generated concurrently in parallel completely independent of each other.

EXEMPLARY EMBODIMENT

In the following, an example implementation of the invention is described for the CRC code generator polynomial, $$G(x) = (1+x^2+x^{15}+x^{17}+x^{30}+x^{31}) = (1+x)(1+x+x^{15}+x^{16}+x^{30}). \quad (34)$$

Figure 1:
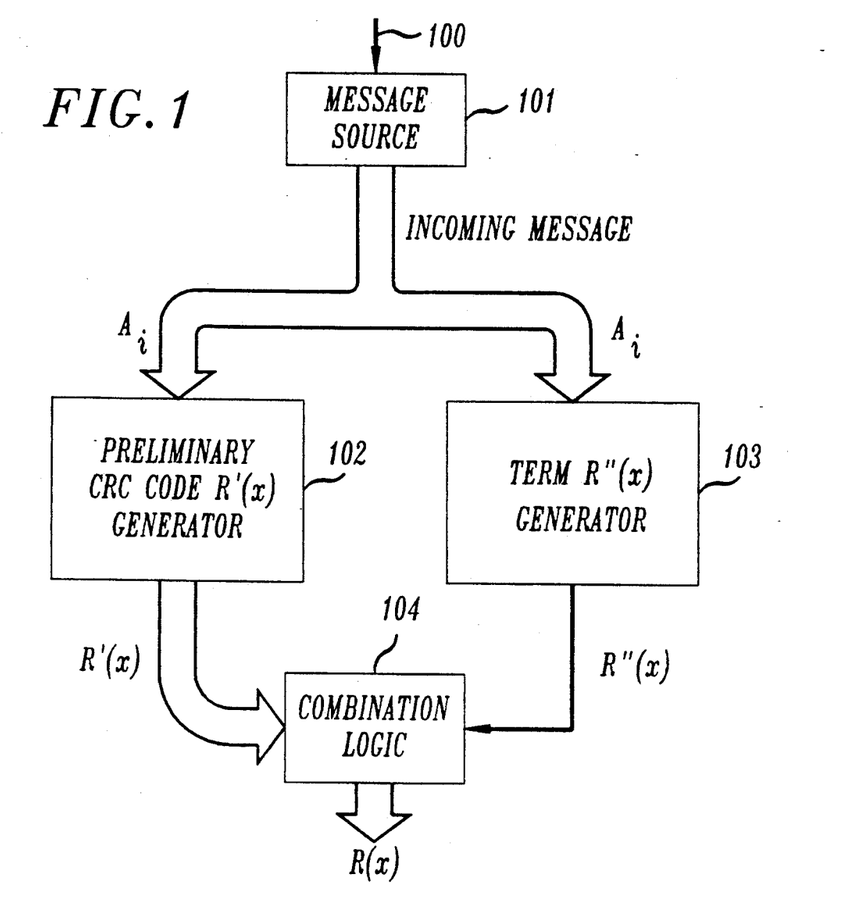
FIG. 1 shows, in simplified block diagram form, an arrangement for generating CRC code words in parallel.

FIG. 1 shows, in simplied block diagram form, an exemplary embodiment for the parallel generation of a CRC code $R'(x)$ utilizing a generator polynomial of the form $(1+x) \cdot f(x)$. Accordingly, shown are message source 101, preliminary CRC code word $R'(x)$ generator 102, term $R''(x)$ generator 103 and combination logic 104. Message source 101 includes apparatus for interfacing to a transmission path 100 or the like to obtain message $M(x)$ over which the CRC code $R(x)$ is to be generated. Blocks of bits of predetermined length $A_i$ of message $M(x)$ are supplied from message source 101 to both preliminary CRC code $R'(x)$ generator 102 and term $R''(x)$ generator 103. In this example, not to be construed as limiting the scope of the invention, each block of bits $A_i$ includes 16 bits in parallel. Preliminary CRC code $R'(x)$ generator 102 is responsive to the supplied blocks of bits $A_i$ of message $M(x)$ to generate the CRC code $R'(x)$ corresponding to $f(x)$ in a manner as described above in the theoretical discussion, namely, in accordance with equation (28). Also, term $R''(x)$ generator 103 is responsive to the supplied blocks of bits $A_i$ to generate the term $R''(x)$ also in a fashion as described above in the theoretical discussion, namely, in accordance with equation (33). It should be noted that $R'(x)$ and $R''(x)$ are only supplied as an output after all the blocks of bits $A_i$ of the entire message $M(x)$ over which the CRC code $R(x)$ is being generated have been input to both of generators 102 and 103. Thereafter, combination logic 104 combines $R'(x)$ and $R''(x)$ to yield the desired CRC code word $R(x)$ as described above in the theoretical discussion, namely, in accordance with equation (18). It should be noted that for the CRC code generator polynomial of equation (34), $R'(x)$ is of degree 30, $R''(x)$ is of degree one (1) and $R(x)$ is of degree 31. Additionally, preliminary CRC code $R'(x)$ is generated in generator 102 independent of term $R''(x)$ being generated in generator 103.

Figure 2:
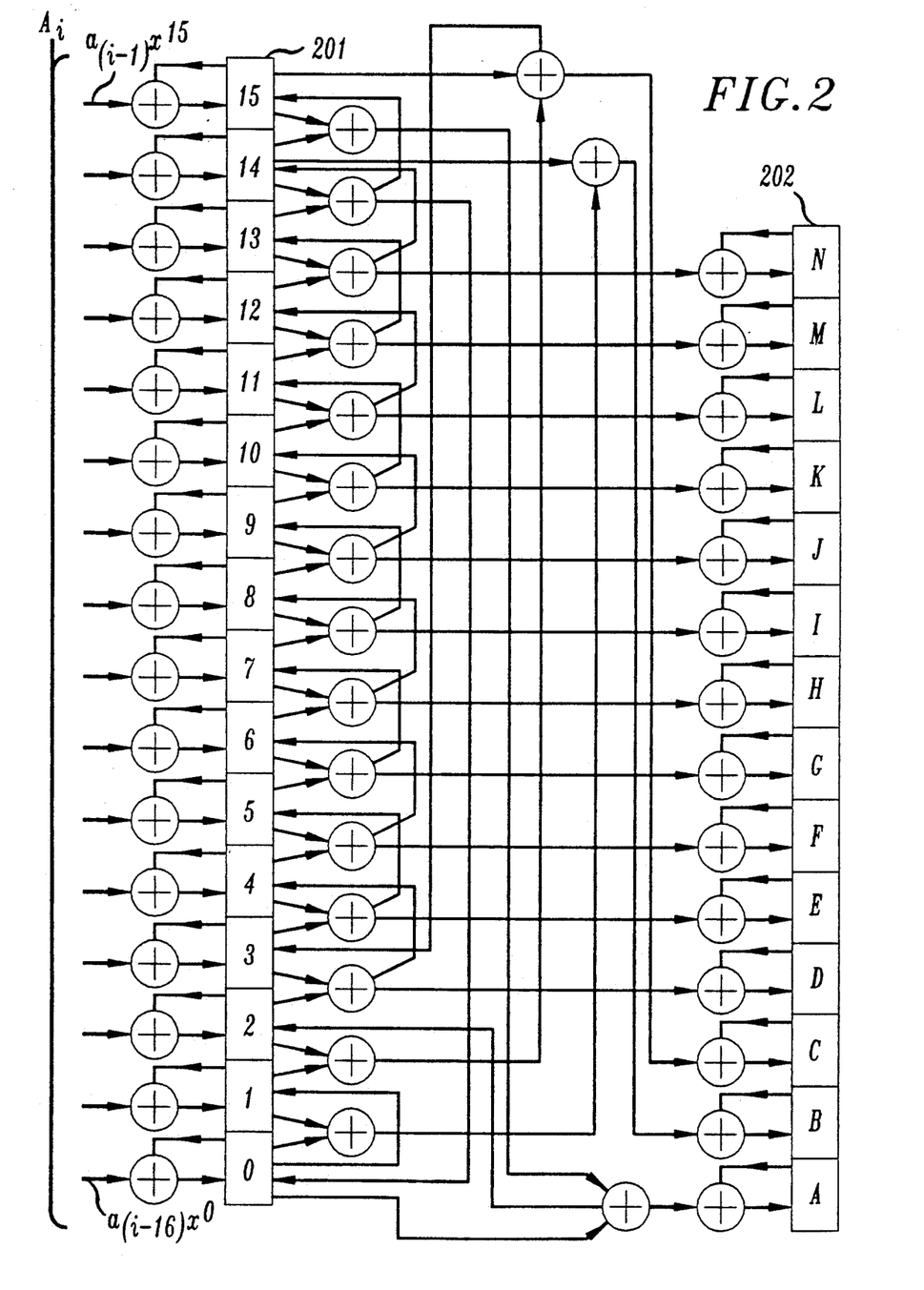
FIG. 2 illustrates, in simplified block diagram form, an arrangement for parallel generation of a preliminary CRC code word corresponding to f(x)
Figure 3:
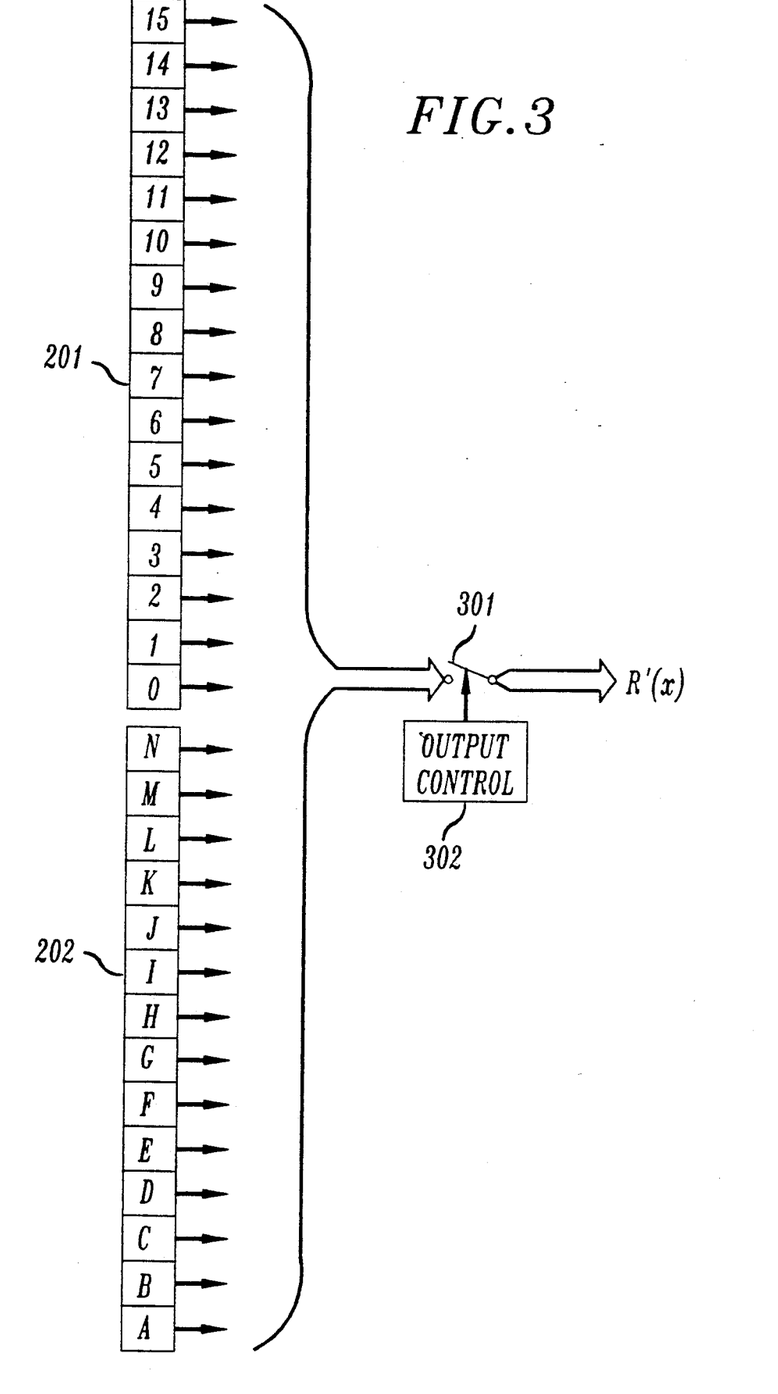
FIG. 3 depicts, in simplified block diagram form, the output of the preliminary CRC code word generator 102 of FIG. 2.

FIG. 2, shows, in simplified block diagram form, details of one arrangement which may be advantageously employed for preliminary CRC code $R'(x)$ generator 102 of FIG. 1. Accordingly, bits $a_{(i-16)}x^0$ through $a_{(i-1)}x^{15}$ in each of blocks of bits $A_i$ of message $M(x)$ are supplied to a corresponding plurality of EXCLUSIVE OR gates and then to stages of register 201, as shown. Register 201 in this example is a shift register having 16 stages. Outputs from register 201 are combined in additional EXCLUSIVE OR gates and then supplied to register 202. In this example, register 202 is also a shift register including stages A through N. Registers 201 and 202 are initialized so that all stages are in a zero (0) state. It is noted that outputs from registers 201 and 202, which in combination, form the preliminary CRC code $R'(x)$ are not shown for clarity of exposition. The outputs from registers 201 and 202 are shown in FIG. 3 as being supplied as an output via controllable switch 301 under control of output control 302 after all the blocks of bits $A_i$ of message $M(x)$ have been processed. It is noted that the symbol $\oplus$ represents an EXCLUSIVE OR gate and that an arrow into a register stage or an EXCLUSIVE OR gate represents an input and an arrow out of a register stage or an EXCLUSIVE OR gate represents an output.

Figure 4:
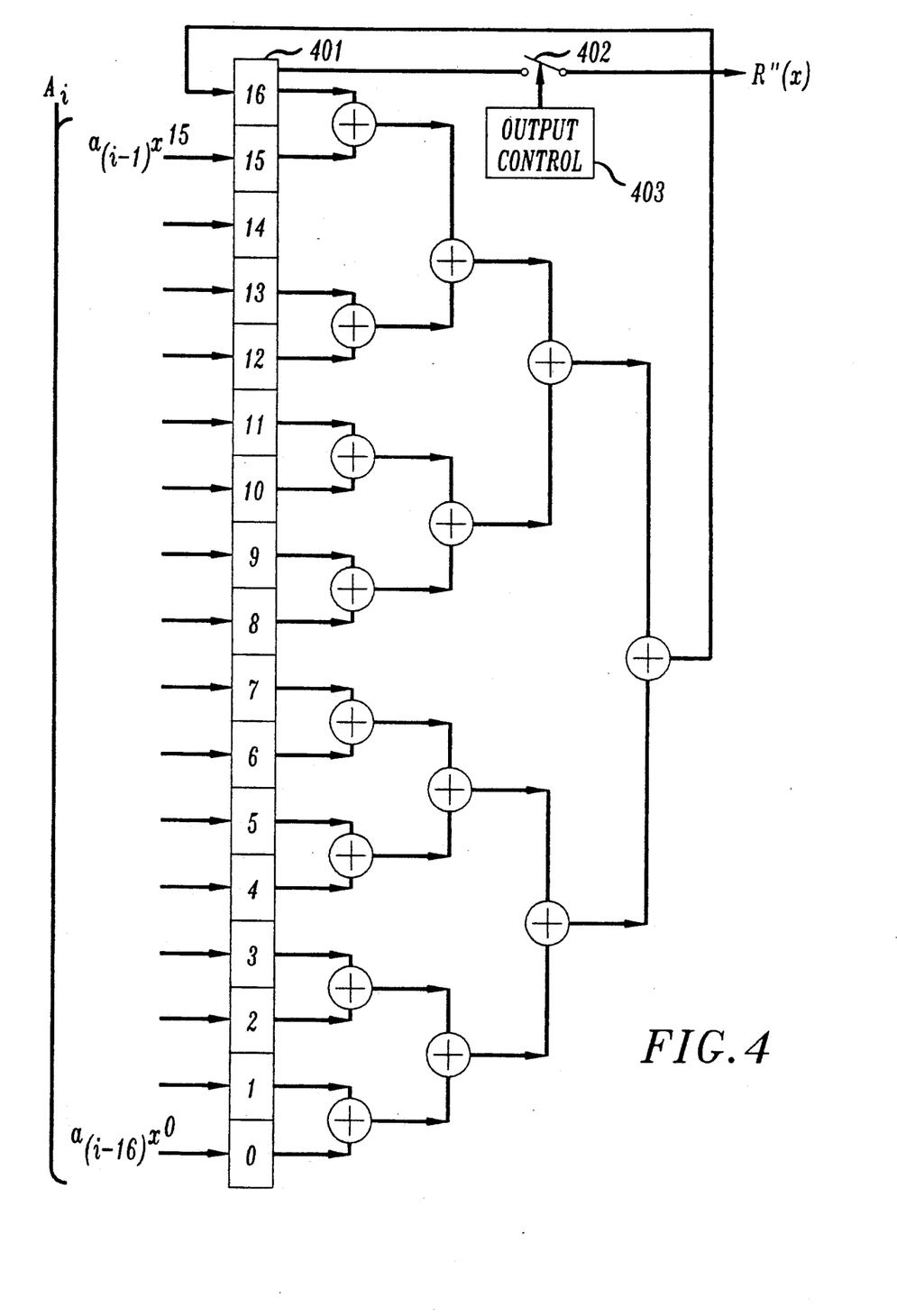
FIG. 4 shows, in simplified block diagram form, an arrangement for generating the term corresponding to $(1+x)$.

FIG. 4 shows, in simplified block diagram form, one arrangement which may be advantageously employed in term $R''(x)$ generator 103 of FIG. 1. Accordingly, bits $a_{(i-16)}x^0$ through $a_{(i-1)}x^{15}$ in each of blocks of bits $A_i$ of message $M(x)$ are supplied to stages 0 through 15, respectively, of register 401. In this example, register 401 includes 16 stages. Register 401 is initialized so that each stage is in a zero (0) state. Outputs from stages 0 through 13 and 15 and 16 of register 401 are combined via EXCLUSIVE OR gates, as shown. The end result of the EXCLUSIVE ORing after processing all blocks $A_i$ of message $M(x)$ is supplied as an input to stage 16 of register 401. An output from stage 16 of register 401 is the desired term $R''(x)$ which is supplied as an output via controllable switch 401 under control of output control 402 after all the blocks of bits $A_i$ of message $M(x)$ have been processed. As indicated above, the $\oplus$ indicates an EXCLUSIVE OR gate and an arrow into a register stage or an EXCLUSIVE OR gate represents an input and arrow out of a register stage or an EXCLUSIVE OR gate represents an output.

Figure 5:
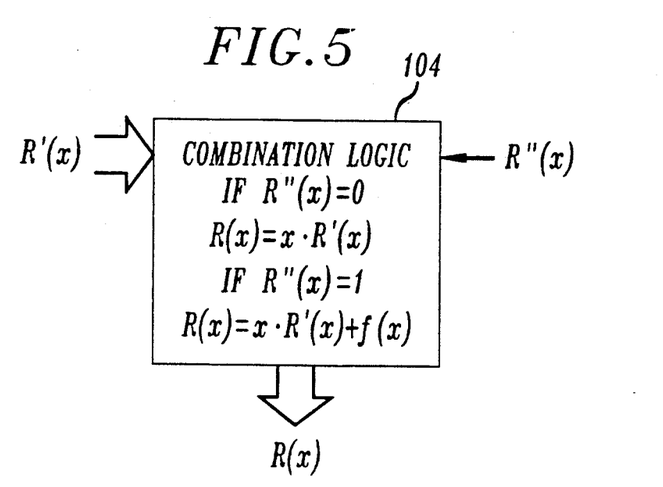
FIG. 5 graphically depicts the function of combination logic unit 104 of FIG. 1.

FIG. 5 graphically represents the function of combination logic 104 of FIG. 1. Combination logic 104 is operative to effect the conditions of equation (18), as indicated above. That is, if $R''(x)$ is a zero (0) the desired CRC code $R(x)$ is obtained by shifting the bits of $R'(x)$ once to the left. If $R''(x)$ is a one (1) the desired CRC code $R(x)$ is obtained by shifting the bits of $R'(x)$ once to the left and adding the function $f(x)$ to the shifted $R'(x)$.

I claim:

1. A method for a parallel generation of a digital representation of an overall cyclic redundancy check (CRC) code word of a form $(1 \times x) \cdot f(x)$ for a message $M(x)$, comprising steps of:

interfacing to a transmission path to obtain blocks of bits $A_i$ in parallel of the message $M(x)$;

simultaneously loading each bit within a given block of bits $A_i$ into a specific one of a plurality of input ports of a first combinational logic circuit which independently generates a digital representation of a preliminary CRC code word using a digital representation of a polynomial $f(x)$ in response to said given block of bits $A_i$ of said message $M(x)$;

simultaneously loading each bit within said given block of bits $A_i$ into a specific one of a plurality of input ports of a second combinational logic circuit which independently generates a digital representation of a term corresponding to a factor of $(1+x)$ in response to said given block of bits $A_i$ of said message $M(x)$; and providing said digital representation of said preliminary CRC code word generated by said first combinational logic circuit and said digital representation of said term corresponding to said $(1 \times x)$ factor generated by said second combinational logic circuit to a third combinational logic circuit which modifies said digital representation of said preliminary CRC code in a prescribed manner in response to said digital representation of said term corresponding to said $(1 \times x)$ factor to obtain said digital representation of said overall CRC code word.

2. The method as defined in claim 1, wherein said step of simultaneously loading each bit within a given block of bits $A_i$ into a specific one of a plurality of input ports of said first combinational logic circuit and generating said digital representation of said preliminary CRC code word, and said step of simultaneously loading each bit within a given block of bits $A_i$ into a specific one of a plurality of input ports of said second combinational logic circuit and generating said digital representation of said term corresponding to said $(1 \times x)$ factor, are performed concurrently.

3. The method as defined in claim 2, wherein said generated digital representation of said term corresponding to said (1×x) factor has either a first prescribed state or a second prescribed state.

4. The method as defined in claim 3, wherein said third combinational logic circuit which modifies said digital representation of said preliminary CRC code includes modifying said digital representation of said preliminary CRC code word in a first prescribed manner when said digital representation of said term corresponding to said (1×x) factor has said first prescribed state and modifying said digital representation of said preliminary CRC code word in a second prescribed manner when said term corresponding to said digital representation of said (1+x) factor has said second prescribed state.

5. The method as defined in claim 4, wherein said first prescribed state is a logical 0 and said second prescribed state is a logical 1, and wherein said first prescribed manner of modifying said digital representation of said preliminary CRC code word comprises shifting the bits of said digital representation of said preliminary CRC code word once to the left, and wherein said second prescribed manner of modifying said digital representation of said preliminary CRC code word comprises shifting the bits of digital representation of said preliminary CRC code word once to the left and adding a digital representation of polynomial f(x) to the shifted digital representation of said preliminary CRC code word.

6. The method as defined in claim 5, wherein said digital representation of said preliminary CRC code word is generated within said first combinational logic circuit in accordance with a remainder $$R'(x) = \left[ \frac{x^{(r-1)}M(x)}{f(x)} \right],$$

where R'(x) is the preliminary CRC code word, M(x) is the message over which the overall CRC code word is being generated, (r) is a degree of the polynomial (1+x)·f(x), and (r−1) is a degree of polynomial f(x).

7. The method as defined in claim 6, wherein said digital representation of said term corresponding to said (1+x) factor is generated within said second combinational logic circuit in accordance with a remainder $$R''(x) = \left[ \frac{Q'(x)}{(1+x)} \right],$$

where R''(x) is the term corresponding to said (1×x) factor and Q'(x) is a quotient polynomial obtained from said message M(x).

8. Apparatus for a parallel generation of a digital representation of an overall cyclic redundancy check (CRC) code word of a form (1×x)·f(x) for a message M(x), comprising:
means for interfacing to a transmission path to obtain blocks of bits $A_i$ in parallel of the message M(x);
first combinational logic circuit for simultaneously receiving each bit within a given block of bits $A_i$ from said interface means into a specific one of a plurality of input ports of said first combinational logic circuit, said first combinational logic circuit independently generating a digital representation of a preliminary CRC code word according to a digital representation of a polynomial f(x) in response to said given block of bits $A_i$ of said message M(x);
second combinational logic circuit for simultaneously receiving each bit within said given block of bits $A_i$ from said interface means into a specific one of a plurality of input ports of said second combinational logic means, said second combinational logic means independently generating a digital representation of a term corresponding to a factor of (1+x) in response to said given block of bits $A_i$ of said message M(x); and
third combinational logic circuit responsive to said generated digital representation of said term corresponding to a (1+x) factor for modifying said digital representation of said preliminary CRC code word in a prescribed manner to obtain said digital representation of said overall CRC code word.

9. The apparatus as defined in claim 8, wherein said first combinational logic circuit, and said second combinational logic circuit operate concurrently to respectively generate said digital representation of said preliminary CRC code word and said digital representation of said term corresponding to said (1+x) factor.

10. The apparatus as defined in claim 9, wherein said digital representation of said term corresponding to said (1×x) factor generated by said second combinational logic circuit has either a first prescribed state or a second prescribed state.

11. The apparatus as defined in claim 10, wherein said third combinational logic circuit includes means for modifying said digital representation of said preliminary CRC code word in a first prescribed manner when said digital representation of said term corresponding to said (1×x) factor has said first prescribed state and means for modifying said digital representation of said preliminary CRC code word in a second prescribed manner when said digital representation of said term corresponding to said (1+x) factor has said second prescribed state.

12. The apparatus as defined in claim 11, wherein said first prescribed state is logical 0 and said second prescribed state is a logical 1, and wherein said first prescribed manner of modifying said digital representation of said preliminary CRC code word within said third combinational logic circuit comprises shifting the bits of said digital representation of said preliminary CRC code word once to the left, and wherein said second prescribed manner of modifying said digital representation of said preliminary CRC code word within said third combinational logic circuit comprises shifting said bits once to the left and adding a digital representation of polynomial f(x) to the shifted digital representation of said preliminary CRC code word.

13. The apparatus as defined in claim 12, wherein said first combinational logic circuit includes means for generating said digital representation of said preliminary CRC code word in accordance with a remainder $$R'(x) = \left[ \frac{x^{(r-1)}M(x)}{f(x)} \right]$$

where R'(x) is the preliminary CRC code word, M(x) is the message over which the overall CRC code word is being generated, (r) is a degree of the polynomial (1×x)·f(x), and (r−1) is a degree of polynomial f(x).

14. The apparatus as defined in claim 13, wherein said second combinational logic circuit includes means for generating said digital representation of said term corresponding to said (1×x) factor in accordance with a remainder $$R''(x) = \left[ \frac{Q'(x)}{(1+x)} \right],$$

where R''(x) is the term corresponding to said (1×x) factor.

* * * * *